(12) United States Patent
Otsuka et al.

(10) Patent No.: US 6,307,791 B1
(45) Date of Patent: Oct. 23, 2001

(54) SEMICONDUCTOR DEVICE

(75) Inventors: Nobuaki Otsuka, Tokyo; Yasushi Kameda, Kanagawa-ken, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/667,220

(22) Filed: Sep. 21, 2000

(30) Foreign Application Priority Data

Sep. 22, 1999 (JP) ............................................. P11-269520

(51) Int. Cl.[7] .................................................... G11C 7/00

(52) U.S. Cl. ............................... 365/189.05; 365/230.08; 365/189.11; 326/30

(58) Field of Search ....................... 365/189.05, 230.08, 365/189.11; 326/30

(56) References Cited

U.S. PATENT DOCUMENTS

| | | | |
|---|---|---|---|
| 5,200,926 | * 4/1993 | Iwahashi et al. | 365/189.05 |
| 5,226,011 | * 7/1993 | Yanagisawa | 365/189.05 |
| 6,188,237 | * 2/2001 | Suzuki et al. | 326/30 |
| 6,201,405 | * 3/2001 | Hedberg | 326/30 |

FOREIGN PATENT DOCUMENTS 2000-183717  6/2000 (JP) .

OTHER PUBLICATIONS

Pilo, H. et al., "A 300MHz, 3.3V 1Mb SRAM Fabricated in a 0.5μm CMOS Process", ISSCC96/Session 9/SRAM/Paper FA 9.3, p. 148, Feb. 1996.

* cited by examiner

*Primary Examiner*—Huan Hoang
(74) *Attorney, Agent, or Firm*—Finnegan, Henderson, Farabow, Garrett & Dunner, L.L.P.

(57) ABSTRACT

A semiconductor device has an output buffer having transistors connected in parallel for an external driving purpose, a connection terminal connected to an external resistor, and an output impedance controller connected to the connection terminal and the output buffer, for adjusting the impedance of the output buffer in accordance with the external resistor. The output impedance controller has a first transistor of a first conductivity type having a drain connected to the connection terminal; a first level-controller connected to a gate of the first transistor, for controlling the level of the gate of the first transistor to set the connection terminal to a predetermined voltage level; a second transistor having a gate connected to the gate of the first transistor and a source connected to a source of the first transistor; a first dummy transistor group consisting of transistors that are of a second conductivity type, are connected to the second transistor, correspond to the output buffer transistors, and are connected in parallel; a first controller connected to the second transistor and the first dummy transistor group, for controlling the first dummy transistor group to equalize the level of a connection node between the second transistor and the first dummy transistor group with the predetermined voltage level; and a second controller for controlling the output buffer transistors according to the control carried out by the first controller.

10 Claims, 11 Drawing Sheets

SEMICONDUCTOR DEVICE

CROSS REFERENCE TO RELATED APPLICATIONS

This application claims benefit of priority under 35 USC 119 based on Japanese patent application PH11-269520 filed Sep. 22, 1999, the entire contents of which are incorporated by reference herein.

BACKGROUND OF THE INVENTION

1. Field of the Invention

The present invention relates to semiconductor devices, and particularly, to a semiconductor device having an output impedance controller that controls the impedance of an output buffer with the use of an external resistor.

2. Description of Related Art

Improving MPU performance is requiring memories of faster data transfer rates. For example, external cache memories are required to operate at several hundred megahertz.

To realize such high-frequency data transfer from a memory to an MPU, the impedance of an output buffer of the memory needs to be matched with the impedance of a board data bus in consideration of data bus conditions such as signal reflection. The higher the operating frequency, the more the accuracy of impedance matching is required. To achieve this, a technique of correcting impedance errors caused by various factors is used.

In this technique, drive ability is adjusted to the predetermined value to change the size of transistors, i.e., the impedance of an output buffer of a memory if the characteristics of the transistors deviate from required ones due to manufacturing variations or varying operation conditions including operation temperatures and voltages. This technique is called a programmable impedance control function.

Figure 1:
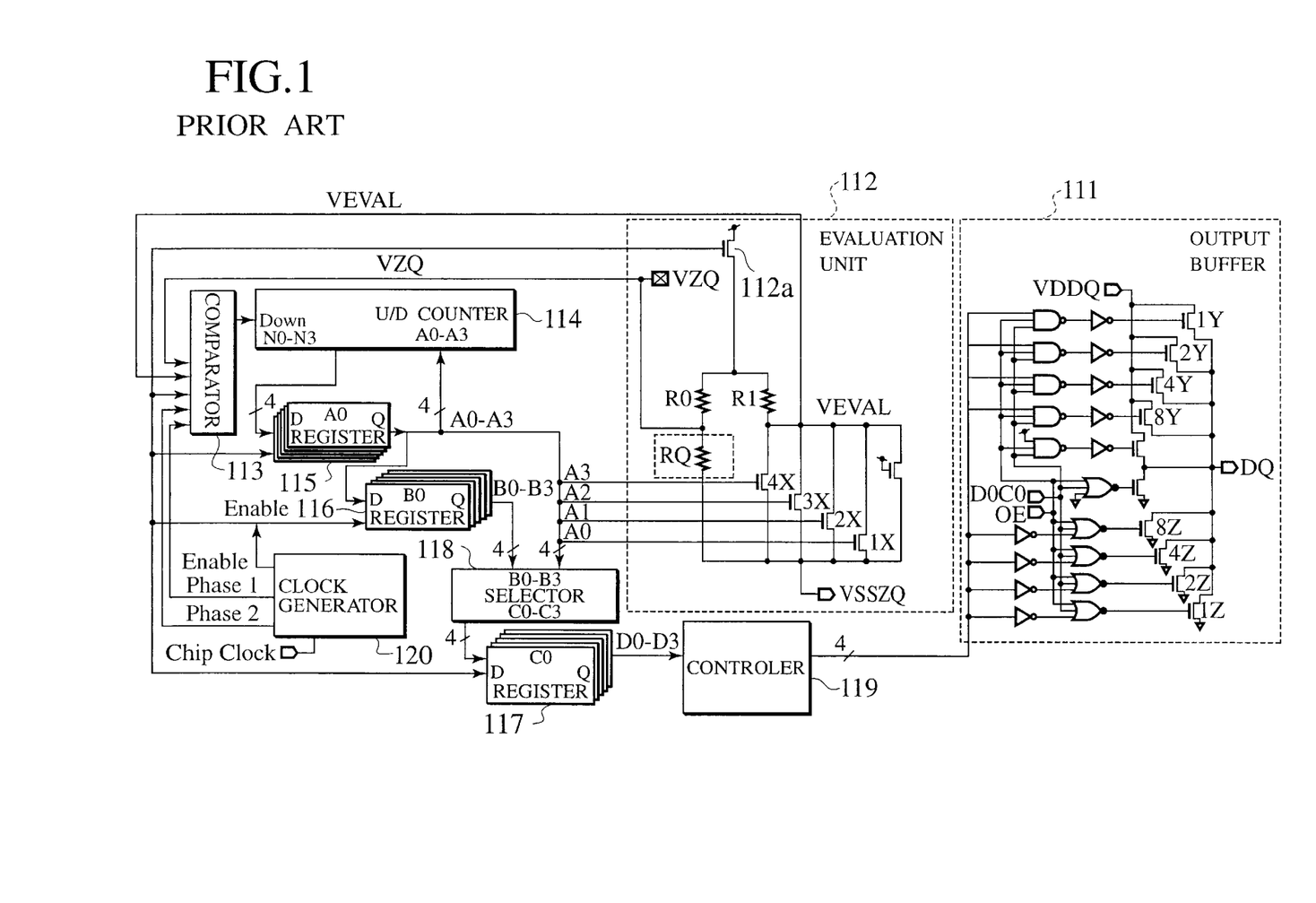
FIG. 1 a block diagram showing a programmable impedance output buffer according to a prior art.

FIG. 1 shows a circuit according to a prior art for achieving the programmable impedance control (The source "Digest of Tech papers (IEEE) Feb. 8, 1996: ISSCC96 Page 148"). This circuit includes an output buffer 111 and an output impedance controller, which consists of elements 112 to 120 to control the output impedance of the output buffer 111. An external resistor RQ is selected as an impedance source according to which the impedance of the output buffer 111 is adjusted. The resistor RQ is connected to a ZQ-terminal. The output impedance controller controls the number of active transistors in the output buffer 111, to match the output impedance of the output buffer 111 with the impedance of the resistor RQ.

In FIG. 1, the output impedance controller includes an evaluation unit 112, a comparator 113, an up/down (U/D) counter 114, registers 115 to 117, a selector 118, a data update controller 119, and a clock generator 120.

The evaluation unit 112 has a reference current source consisting of an NMOS transistor 112a and resistors R0 and R1, and a dummy buffer consisting of transistors 1X, 2X, 4X, and 8X. The number of transistors in the dummy buffer is equal to or a multiple of the number of transistors in the output buffer 111. The reference current source generates a voltage VZQ for the ZQ-terminal and a voltage VEVAL for the dummy buffer. The voltages VZQ and VEVAL are transferred to the comparator 113. The output of the comparator 113 controls the counter 114, which turns on and off the NMOS transistors 1X to 8X of the dummy buffer to equalize the voltages VZQ and VEVAL.

In this way, the impedance of the dummy buffer is matched with that of the resistor RQ.

Data used to adjust the impedance of the dummy buffer in accordance with the resistor RQ is transferred to the output buffer 111 through the data update controller 119. Based on the data, drive transistors 1Y to 8Y and 1Z to 8Z of the output buffer 111 are selectively turned on and off to equalize the impedance of the output buffer 111 with the impedance determined by the resistor RQ.

In FIG. 1, the pull-up and pull-down sides of the output buffer 111 consist each of NMOS transistors, and therefore, manufacturing variations and operating variations on these transistors are equal. Accordingly, the dummy buffer may have a single system of NMOS transistors to control the ON/OFF states of the transistors of the output buffer 111.

If the pull-up side of the output buffer 111 is made of PMOS transistors, the dummy buffer must additionally have a system of PMOS transistors to adjust the impedance of the output buffer 111 because PMOS transistors involve different manufacturing variations from NMOS transistors.

Figure 2:
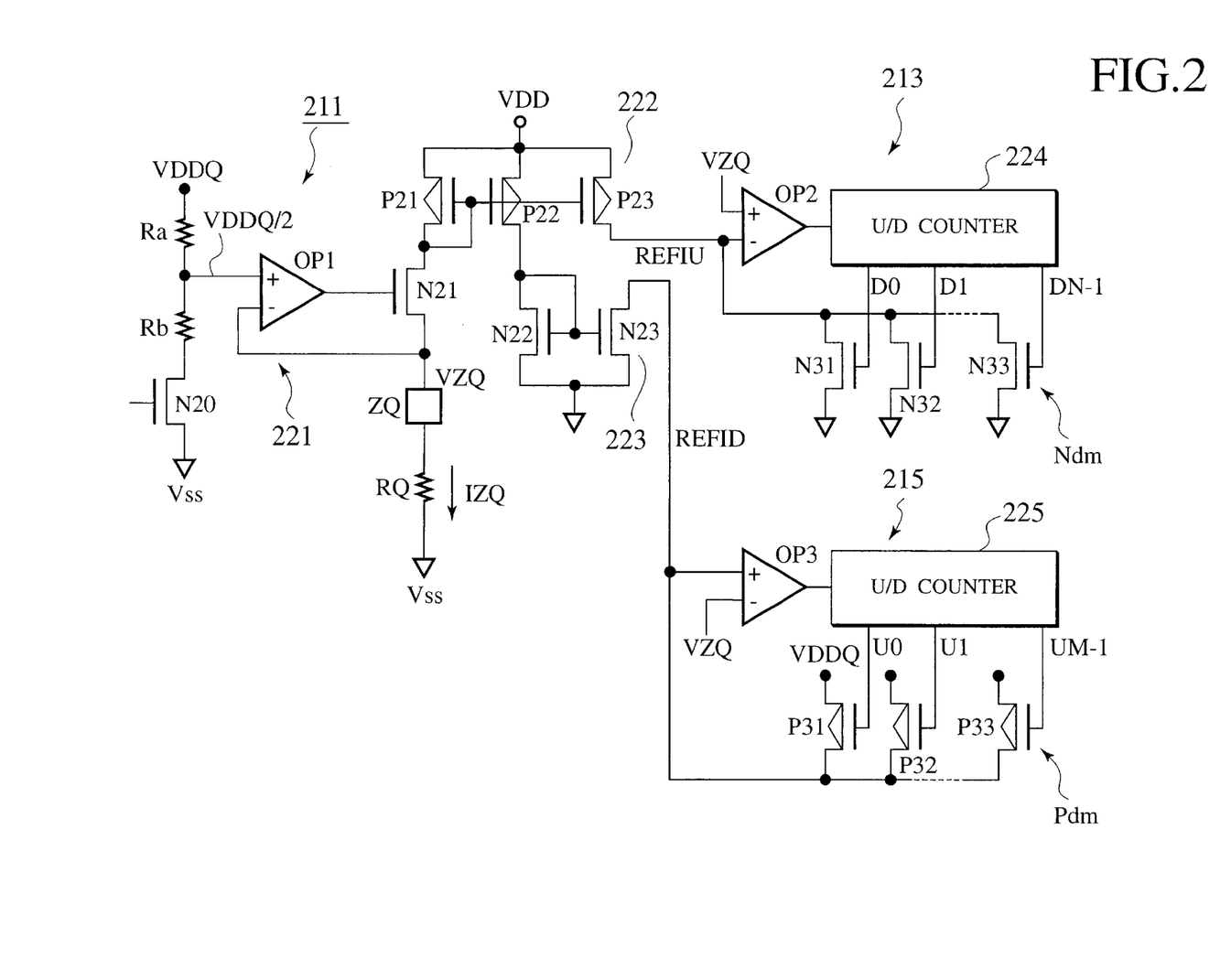
FIG. 2 is a circuit diagram showing an output impedance controller according to a prior art.

FIG. 2 shows an output impedance controller according to a related art, for adjusting the impedance of two systems in a programmable impedance output buffer.

The output impedance controller has a reference current source 211 that includes a reference voltage generator 221. The reference voltage generator 221 uses a voltage VDDQ that is between a high voltage VDD and a low voltage VSS to apply a fixed voltage to a ZQ-terminal. The reference voltage generator 221 has voltage dividing resistors Ra and Rb and an activation NMOS transistor N20 and generates a reference voltage VDDQ/2. The reference voltage VDDQ/2 is applied to a noninverted input terminal of an operational amplifier OP1. The output of the operational amplifier OP1 controls an NMOS transistor N21 whose source is fed back to an inverted input terminal of the operational amplifier OP1. As a result, the ZQ-terminal receives the reference voltage VZQ=VDDQ/2.

The reference voltage VZQ is applied to the ZQ-terminal so that a current IZQ flows through an external resistor RQ connected to the ZQ-terminal. The current IZQ is a reference current representing the resistance of the resistor RQ. PMOS transistors P21 and P23 form a current mirror circuit that forms a current feed source 222 to feed a current from the power source VDD to a pull-down dummy buffer Ndm according to the reference current IZQ.

A current mirror circuit consisting of the PMOS transistors P21 and P22 and a current mirror circuit consisting of NMOS transistors N22 and N23 connected to the output of the current mirror circuit of P21 and P22 form a current pull-in source 223 that pulls a current from a pull-up dummy buffer Pdm into the power source VSS.

The output impedance controller also has a pull-down controller 213. The pulldown controller 213 has an operational amplifier OP2 to receive a voltage from a connection node REFIU and the voltage VZQ from the ZQ-terminal, and a U/D counter 224 for carrying out up/down counting in response to the output of the operational amplifier OP2. The output impedance controller also has a pull-up controller 215. The pull-up controller 215 has an operational amplifier OP3 to receive a voltage from a connection node REFID and the voltage VZQ from the ZQ-terminal, and a U/D counter 225 for carrying out up/down counting in response to the output of the operational amplifier OP3.

The pull-down dummy buffer Ndm has N pieces of NMOS transistors (N31 to N33 in FIG. 2). The drains of the transistors N31 to N33 are commonly connected to the connection node REFIU. The sources of the transistors N31 to N33 are commonly connected to the power source VSS, and the gate widths of these transistors are set as, for example, 1:2:4.

The counter 224 provides N pieces of output bits D0 to Dn−1 that are supplied to the gates of the transistors N31 to N33, respectively. The pull-down controller 213 determines the ON/OFF states of the transistors N31 to N33 so that a voltage at the connection node REFIU may agree with the voltage VZQ, thereby determining the impedance of the dummy buffer Ndm.

The pull-up dummy buffer Pdm has M pieces of PMOS transistors (P31 to P33 in FIG. 2). The drains of the transistors P31 to P33 are commonly connected to the connection node REFID. The sources of the transistors P31 to P33 are commonly connected to the power source VDDQ, and the gate widths of these transistors are set as, for example, 1:2:4.

The counter 225 provides M pieces of output bits U0 to Um−1, which are supplied to the gates of the transistors P31 to P33, respectively. The pull-up controller 215 determines the ON/OFF states of the transistors P31 to P33 so that a voltage at the connection node REFID may agree with the voltage VZQ, thereby determining the impedance of the dummy buffer Pdm.

In this way, the impedance of the dummy buffers Ndm and Pdm is determined according to the reference current IZQ that is based on the external resistor RQ. The output bits D0 to Dn−1 and U0 to Um−1 of the pull-down and pull-up controllers 213 and 215 determine the impedance of the dummy buffers Ndm and Pdm, and at the same time, are transferred to an output buffer (not shown in FIG. 2), to set the impedance of the output buffer.

Generally, the impedance of an output buffer or a dummy buffer is not always linear relative to the output level of the buffer. Accordingly, the impedance of an output buffer is defined as a value when the output level of the output buffer is ½ (intermediate output level) of a source voltage VDDQ for driving the output buffer. In FIG. 1, the constant current source is simply formed with the resistors RO and RI, and the impedance of the output impedance controller is set based on the resistance. of the external resistor RQ. If the range of the resistor RQ is narrow (for example, about 50 Ω), there will be no problem because the level of the ZQ-terminal is about VDDQ/2 irrespective of the resistance of the resistor RQ that is connected to the ZQ-terminal. If the range of the resistor RQ is wide (for example, 50 Ω to 70 Ω), there will be a problem because the level of the ZQ-terminal greatly varies depending on the resistance of the resistor RQ. In this case, the impedance of the output impedance controller involves an error corresponding to an impedance linear portion.

On the other hand, the output impedance controller of FIG. 2 controls the impedance thereof by equalizing the level VZQ at the ZQ-terminal as well as the drain levels of the dummy buffers Ndm and Pdm at the connection nodes REFIU and REFID with VDDQ/2. Even if the range of the external resistor RQ is wide, the resistor RQ and the impedance of each dummy buffer are compared with each other as defined, to secure the correctness of impedance provided by the output impedance controller.

The output impedance controller of FIG. 2, however, has the following problems:

(1) As the integration of LsIs improves, source voltage for the LSIs decreases. Even so, the threshold voltage Vth of each transistor in the LSIs is hardly scaled accordingly.

There is no decrease in a sub-threshold leak in response to a decrease in gate voltage because no scaling is made on the S factor (dIg/dVg) of a transistor. And a leak current becomes relatively larger as the threshold voltage Vth of the transistor decreases. Therefore, the sub-threshold leak is unignorably large with respect to a standby current.

On the other hand, the source voltage decrease and the scaled-down elements and design rules reduce load charging/discharging energy and load capacitance, to reduce a gate delay. In a circuit having serially connected transistors, however, the source voltage decrease greatly deteriorates a power source margin if no scaling is made on the threshold voltage Vth of each transistor in response to the source voltage decrease. This is because the threshold voltage Vth including a threshold voltage drop directly influences circuit operation.

This problem will be explained in more detail in connection with the prior art of FIG. 2. To equalize a current supplied to the dummy buffers Ndm and Pdm with the current IZQ flowing to the resistor RQ, the prior art employs the current mirror involving the PMOS transistors P21 to P23 and the NMOS transistors N22 and N23. The gate and drain of each of the transistors P21 and N22 are connected together to provide a standard current mirror, which causes a threshold voltage drop.

The level of the ZQ-terminal is controlled to VDDQ/2 by feeding the level of the ZQ-terminal back to the gate of the transistor N21, which clamps the level. As a result, a threshold voltage drop also occurs at the transistor N21. These threshold voltage drops deteriorate an effective transistor operation voltage.

To correctly mirror a current in the current mirror, the drain current dependence of the transistors whose gates are commonly connected must be suppressed. Namely, it is preferable to increase a drain voltage so that the transistors may operate in a saturation region. Accordingly, the deteriorated voltage margin harms the performance of the current mirror.

According to the prior art of FIG. 2, a current path of the external resistor RQ involves two threshold voltage drops caused by the transistors P21 and N21. If a source voltage is decreased without scaling threshold voltage, the operation margin of each transistor decreases to deteriorate the accuracy of impedance adjustment.

(2) The difference in impedance adjustment between the pull-up side and pull-down side of the prior art of FIG. 2 will be studied.

Figure 3:
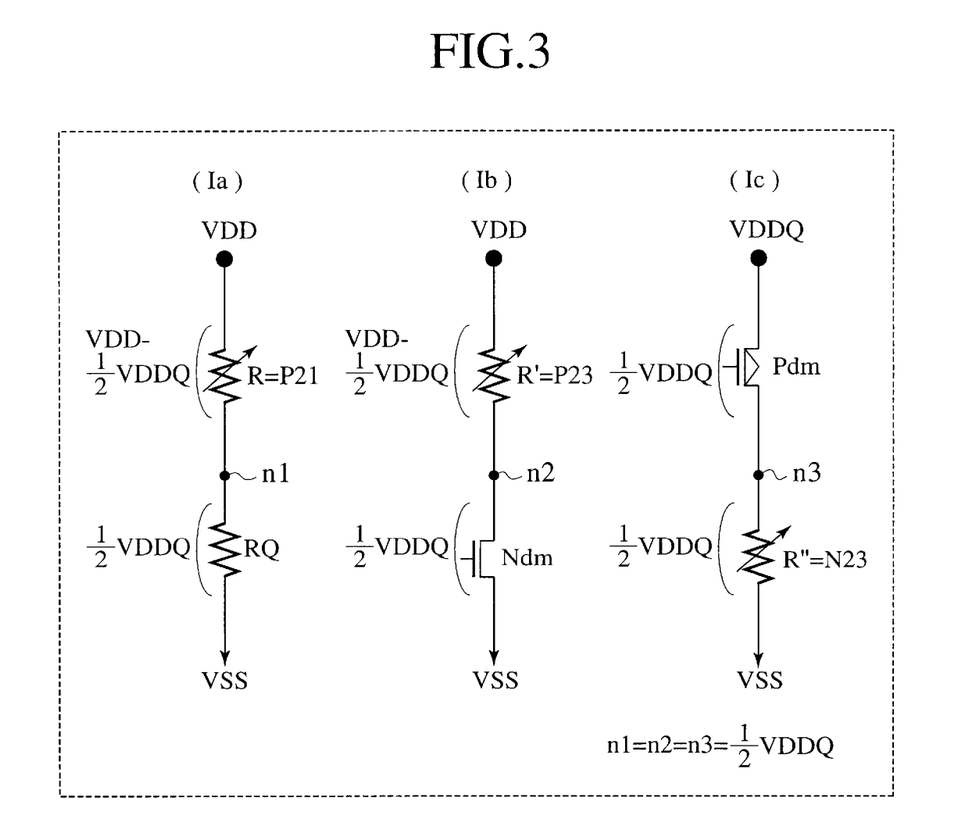
FIG. 3 shows currant paths of the circuit of FIG. 2 represented with dividing resistors.

FIG. 3 shows simplified current paths of the circuit of FIG. 2 represented with dividing resistors. A current path Ia includes a variable resistor R (PMOS transistor P21) and the external resistor RQ connected in series. A current path Ib includes a variable resistor R' (PMOS transistor P23) and the pull-down dummy buffer Ndm connected in series. A current path Ic includes the pull-up dummy buffer Pdm and a variable resistor R" (NMOS transistor N23) connected in series. The variable resistors R, R', and R" are adjusted to equalize potential at each of intermediate connection nodes n1, n2, and n3 with VDDQ/2.

In the current paths Ia and Ib, the resistor RQ and the dummy buffer Ndm have each a voltage difference of VDDQ/2. The variable resistors R and R' are connected to the power source VDD, and therefore, have each a voltage difference of (VDD−VDDQ/2). On the other hand, the current path Ic has the dummy buffer Pdm on the power source side, and therefore, the source terminal of the dummy buffer Pdm is at VDDQ that is supplied to the pull-up transistors of the output buffer.

To control the voltage applied to the dummy buffer Pdm to VDDQ/2, the intermediate connection node n3 should be VDDQ/2. As a result, a voltage applied to the variable resistor R" becomes VDDQ/2. Therefore, the larger voltage should be applied to the variable resistor R" since the variable resistor R" is the transistor that must be driven in a saturation region.

VDDQ for driving the output buffer is usually lower than VDD, and therefore, the following is established:

(VDD−VDDQ/2)>VDDQ/2

Namely, the voltage applied to the pull-up control variable resistor R" is lower than the voltage applied to the variable resistors R and R'. Even if the pull-down part has a large power source margin, the low power source margin of the pull-up part determines a total power source margin, to deteriorate the performance of the circuit as a whole.

(3) The prior art of FIG. 2 employs VDD to control the potential of the intermediate connection nodes n1 to n3 to VDDQ/2. Accordingly, the impedance adjustment accuracy of the circuit of FIG. 2 is affected by noise in VDD as well as noise in VDDQ.

SUMMARY OF THE INVENTION

The present invention is to provide a semiconductor device having an output impedance controller for precisely achieving a programmable impedance control function for an output buffer even with a low-voltage power supply.

The present invention provides a semiconductor device including an output buffer having transistors connected in parallel for an external driving purpose; a connection terminal connected to an external resistor; and an output impedance controller connected to the connection terminal and the output buffer, for adjusting the impedance of the output buffer in accordance with the external resistor. The output impedance controller has a first transistor of a first conductivity type connected to the connection terminal; a first level-controller connected to a gate of the first transistor, for controlling the level of the gate of the first transistor to set the connection terminal to a predetermined voltage level; a second transistor of the first conductivity type having a gate connected to the gate of the first transistor and a source connected to a source of the first transistor; a first dummy transistor group consisting of transistors that are of a second conductivity type, are connected to the second transistor, correspond to the output buffer transistors, and are connected in parallel; a first controller connected to the second transistor and the first dummy transistor group, for controlling the first dummy transistor group to equalize the level of a connection node between the second transistor and the first dummy transistor group with the predetermined voltage level; and a second controller for controlling the output buffer transistors according to the control carried out by the first controller.

BRIEF DESCRIPTION OF THE DRAWINGS

The objects, features, and advantages of the present invention will become more apparent from the following description of the preferred embodiments taken in conjunction with the accompanying drawings, in which.

DESCRIPTION OF THE PREFERRED EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 4:
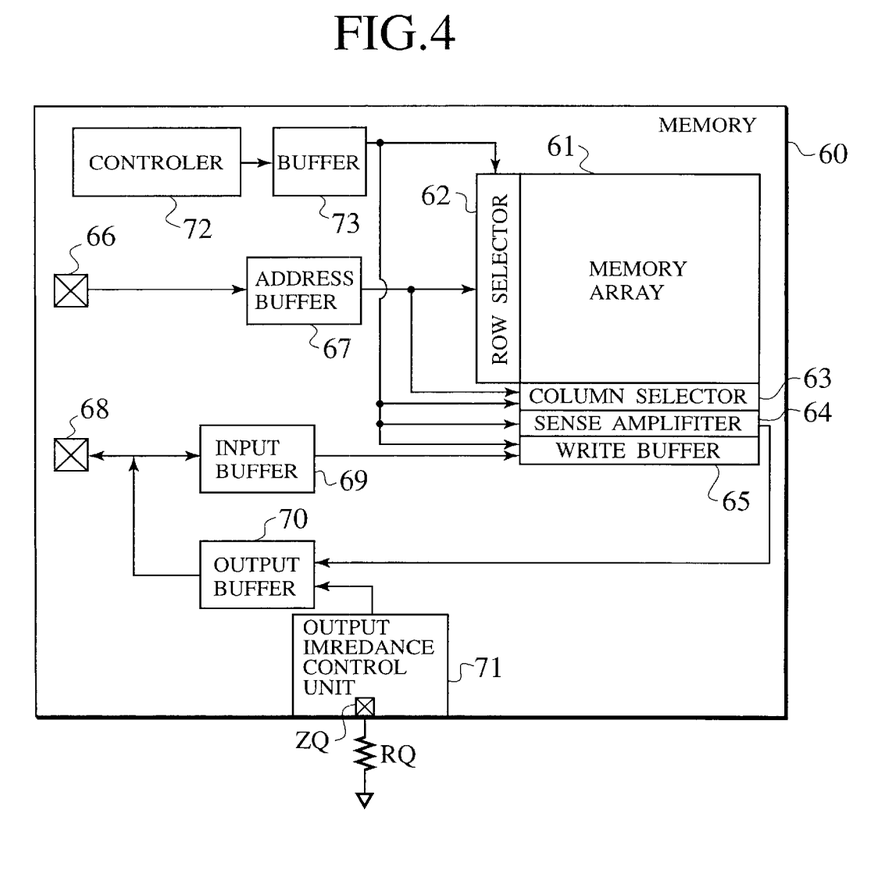
FIG. 4 is a block diagram showing a memory chip serving as a semiconductor device having an output impedance controller.

FIG. 4 is a block diagram showing a memory chip serving as a semiconductor device having an output impedance controller. The memory chip 60 has an address pad 66 that receives address data. The address data is passed through an address buffer 67 to a row selector 62 and a column selector 63, to select a write or read cell in a memory array 61.

To write data into the selected cell in the memory array 61, write data is transferred through an I/O pad 68 and an input buffer 69 to a write buffer 65, from which the write data is stored in the selected cell. To read data out of the selected cell, data stored in the selected cell is read and transferred through a sense amplifier 64 and an output buffer 70 to the I/O pad 68, from which the read data is driven outside the memory chip. A timing controller 72 provides a timing control signal to a buffer 73, which transfers the signal to the row selector 62, column selector 63, sense amplifier 64, and write buffer 65, to control the timing of write and read operations.

The memory chip 60 incorporates the output impedance controller 71 for controlling the impedance of the output buffer 70. The output buffer 70 and output impedance controller 71 form a programmable impedance output buffer to achieve the programmable impedance control function mentioned above.

An external resistor RQ is connected to a ZQ-terminal, to specify a target impedance value. Drive ability of transistors in the output buffer 70 is adjusted to equalize the impedance of the output buffer 70 with the value specified by the resistor RQ or a multiple of the value specified by the resistor RQ. More precisely, the output impedance controller 71 has dummy buffers Ndm and Pdm whose transistors are equal to or a multiple of the transistors of the output buffer 70, the impedance of the dummy buffers Ndm and Pdm is equalized with the resistor RQ, while drive ability of the buffers Ndm and Pdm is changed and the impedance of the output buffer 70 is adjusted according to adjustment made on the impedance of the dummy buffers Ndm and Pdm. The term changing drive ability includes changing the total size of transistors.

Figure 5:
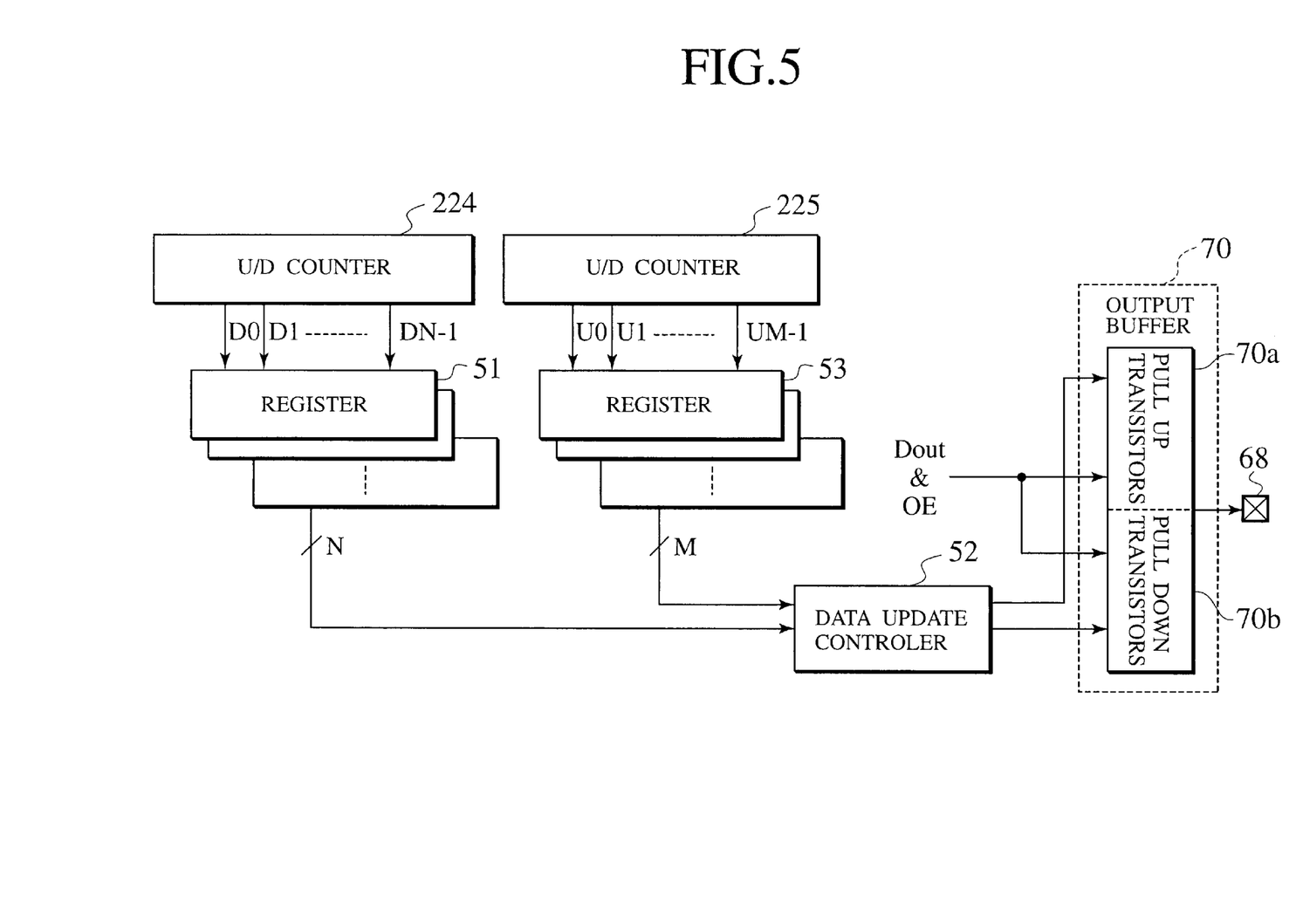
FIG. 5 is a block diagram showing an output impedance controller according to a first embodiment of the present invention.

FIG. 5 is a block diagram showing the output impedance controller 71 according to the first embodiment of the present invention. The output buffer 70 has a pull-up transistor group 70a consisting of PMOS transistors and a pull-down transistor group 70b consisting of NMOS transistors. The impedance of the output buffer 70 is controlled with two systems, i.e., the dummy buffers Pdm and Ndm corresponding to the output buffer transistor groups 70a and 70b, respectively.

The control system for adjusting the impedance of the pull-down transistor group 70b will be explained.

Figure 6:
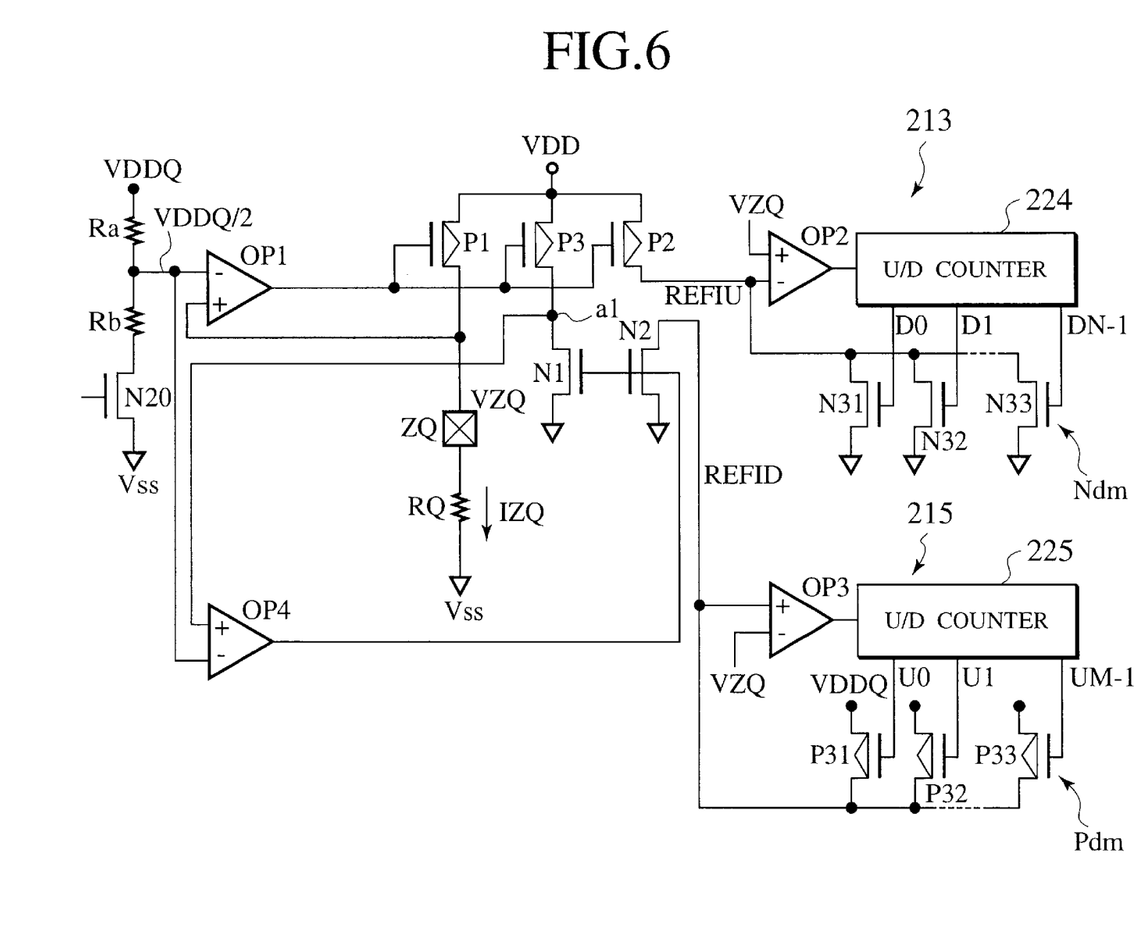
FIG. 6 is a circuit diagram showing the output impedance controller of the first embodiment.

FIG. 6 is a circuit diagram showing the output impedance controller 71 according to the first embodiment of the present invention. This controller 71 has a PMOS transistor P1 (first transistor) connected to the ZQ-terminal in series, and a PMOS transistor P2 (second transistor) whose gate and source are connected to the gate and source of the transistor P1, respectively.

A gate voltage applied to the transistor P1 is controlled by an operational amplifier OP1 (first level-controller) so that a voltage VZQ at the ZQ-terminal is equalized with ½ of a power source voltage VDDQ for driving the output buffer 70.

Here, VDDQ/2 is set as the power voltage according to this embodiment, but it is not limited to this. Various power voltages can be applicable.

Dividing resistors Ra and Rb and an activation NMOS transistor N20 form a voltage generator to generate a reference voltage VDDQ/2, which is supplied to an inverted input terminal of the operational amplifier OP1. The output of the operational amplifier OP1 controls the transistors P1 and P2. The drain of the transistor P1 is fed back to a noninverted input terminal of the operational amplifier OP1, so that the reference voltage VZQ=VDDQ/2 is applied to the ZQ-terminal. The resistors Ra and Rb may each be a transistor. By changing the sizes of the transistors serving as the resistors Ra and Rb, a voltage level applied to the operational amplifier OP1 is changeable. Changing the size of a transistor is carried out by changing the channel width, or gate length, or both of them of the transistor.

An operational amplifier OP2 and an up/down (U/D) counter 224 form a controller 213 (first controller). The counter 224 provides data bits D0 to Dn−1 to selectively turn on and off "n" pieces of NMOS transistors (N31 to N33 in this example, forming a first dummy transistor group) in the dummy buffer Ndm, to equalize the voltage of a connection node REFIU between the transistor P2 and the dummy buffer Ndm with VDDQ/2.

The data bits D0 to Dn−1 from the counter 224 are transferred through a register 51 to a data update controller 52 (second or fourth controller), as shown in FIG. 5. According to the data bits D0 to Dn−1, which are resultant data of control by the controller 213, the data update controller 52 selectively turns on and off transistors in the pull-down transistor group 70b of the output buffer 70.

The control system for adjusting the impedance of the pull-up transistor group 70a of the output buffer 70 will be explained.

In FIG. 6, the output impedance controller 71 has a PMOS transistor P3 (third transistor) whose gate and source are connected to the gate and source of the transistor P1, respectively. The transistor P3 is connected to an NMOS transistor N1 (fourth transistor) in series. The gate and source of the transistor N1 are connected to those of an NMOS transistor N2 (fifth transistor), respectively.

An operational amplifier OP4 (second level-controller) controls the level of the gate of the transistor N1 to equalize the voltage of a connection node a1 between the transistors P3 and N1 with VDDQ/2.

An operational amplifier OP3 and a U/D counter 225 form a controller 215 (third controller). The counter 225 provides data bits U0 to Um−1 to selectively turn on and off "m" pieces of PMOS transistors (P31 to P33 in this example, forming a second dummy transistor group) in the dummy buffer Pdm, to equalize the voltage of a connection node REFID between the transistor N2 and the dummy buffer Pdm with VDDQ/2.

The data bits U0 to Um−1 of the counter 225 are transferred through a register 53 to the data update controller 52, as shown in FIG. 5. According to the data bits U0 to Um−1, which are resultant data of control by the controller 215, the data update controller 52 selectively turns on and off transistors in the pull-up transistor group 70a of the output buffer 70.

In this way, the external resistor RQ for specifying a target impedance value is connected to the ZQ-terminal, and the output impedance controller 71 controls drive ability of active transistors of the output buffer 70 so that the impedance of the output buffer 70 may be equalized with the value specified by the resistor RQ or a multiple of the value specified by the resistor RQ.

The first embodiment inserts the PMOS transistors P1 to P3 into a ZQ-terminal current path, a pull-down control current path, and a pull-up control current path, respectively, and commonly connects the gates of the transistors P1 to P3. As a result, the first embodiment causes no threshold voltage drop, unlike the prior art of FIG. 2 that connects the gate and drain of the PMOS transistor P21 to each other to cause a threshold voltage drop.

The first embodiment employs the feedback circuit including the operational amplifier OPI, to control the level of the ZQ-terminal to VDDQ/2. Since the first embodiment employs the PMOS transistor P1 to control the level of the ZQ-terminal, no threshold voltage drop occurs, unlike the prior art of FIG. 2 that employs the NMOS transistor N21 for the same purpose to cause a threshold voltage drop.

In the pull-down control current path, the first embodiment controls the drain level (the connection node REFIU) of the transistor P2, i.e., the drain level of the dummy buffer Ndm to VDDQ/2. In the pull-up control current path, the first embodiment controls the drain (connection node a1) of the transistor P3 to VDDQ/2.

Namely, the first embodiment equally controls the drain levels of the transistors P1 to P3 to VDDQ/2 and commonly connects the gates of these transistors P1 to P3. If these transistors have identical drive ability, they pass an identical current. As a result, these transistors provide the same function as the current mirror of FIG. 2.

To correctly mirror a current and to eliminate drain-current dependence, the current mirror of the prior art of FIG. 2 must operate the transistors thereof in a saturation region. As a result, the prior art causes threshold voltage drops to deteriorate the accuracy of current mirroring and impose a severe voltage margin. On the other hand, the first embodiment of the present invention equalizes the gate and drain voltages of the transistors P1 to P3, to eliminate the restriction on transistor operating areas and greatly improve a voltage margin.

The prior art separately achieves mirroring with the PMOS transistor P21 and level controlling with the NMOS transistor N21. On the other hand, the first embodiment of the present invention achieves them with the single PMOS transistor P1, to reduce the number of serially arranged transistors. Then, a shortage of power source margin can be eliminated due to the vertical arrangement.

In addition, the first embodiment commonly connects the gates of the NMOS transistors N1 and N2 and adjusts the drains of these transistors, i.e., the connection nodes a1 and REFID to VDDQ/2, to correctly achieve current mirroring for the dummy buffer Pdm.

Compared with the prior art, the first embodiment of the present invention needs a level adjustment to VDDQ/2 at the connection node a1 in addition to level adjustments to VDDQ/2 at the ZQ-terminal and connection nodes REFIU and REFID.

Although this may increase current consumption, the current consumption of the four VDDQ/2 adjustment points can be minimized because these points need no highspeed operation. Accordingly, the current consumption increase due to this will be negligible compared with total power consumption.

Figure 7:
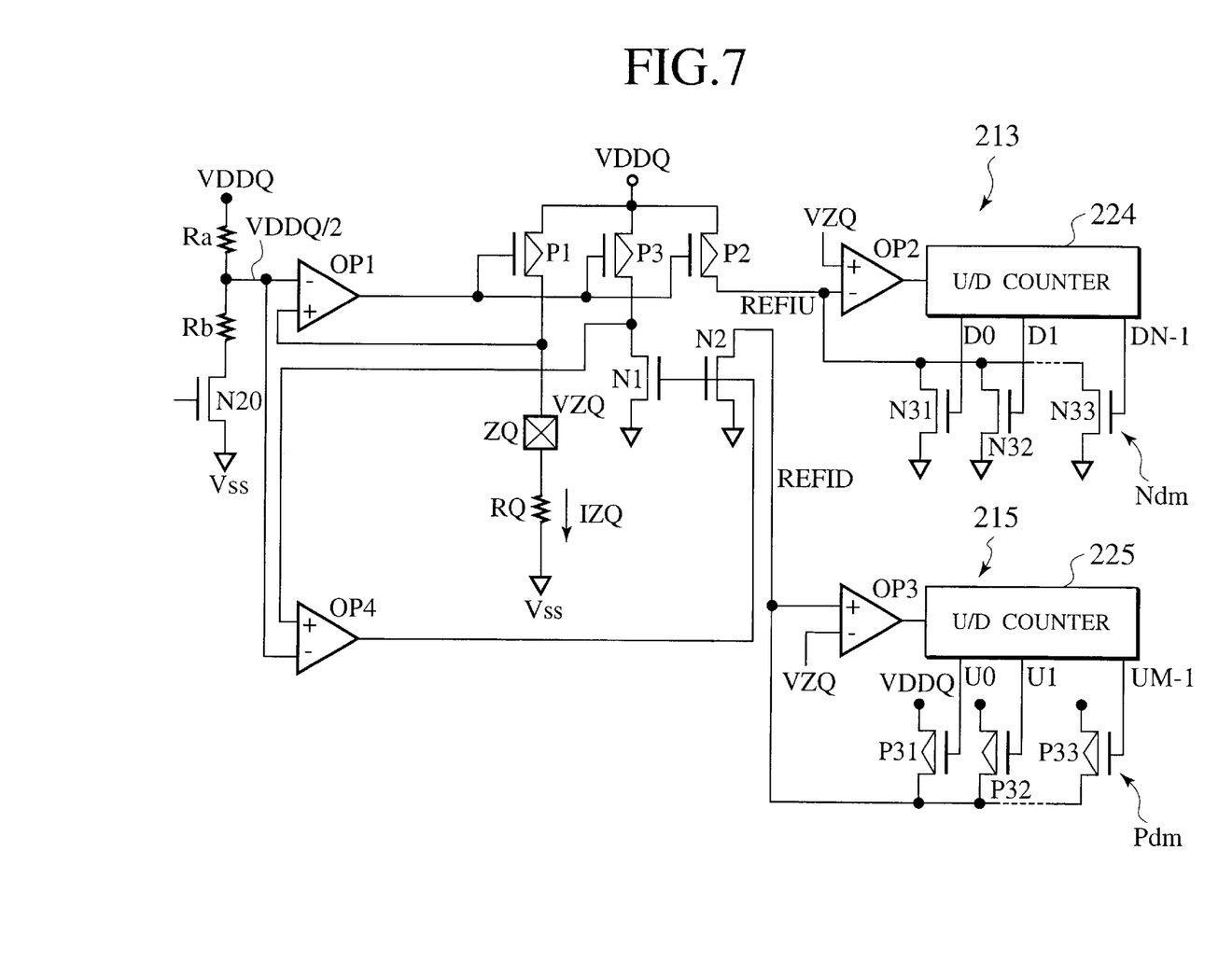
FIG. 7 is a circuit diagram showing an output impedance controller according to a second embodiment of the present invention.

FIG. 7 is a circuit diagram showing an output impedance controller of a semiconductor device according to the second embodiment of the present invention. This embodiment differs from the first embodiment of FIG. 6 in that it connects PMOS transistors P1 to P3 to a power source VDDQ.

Figure 8:
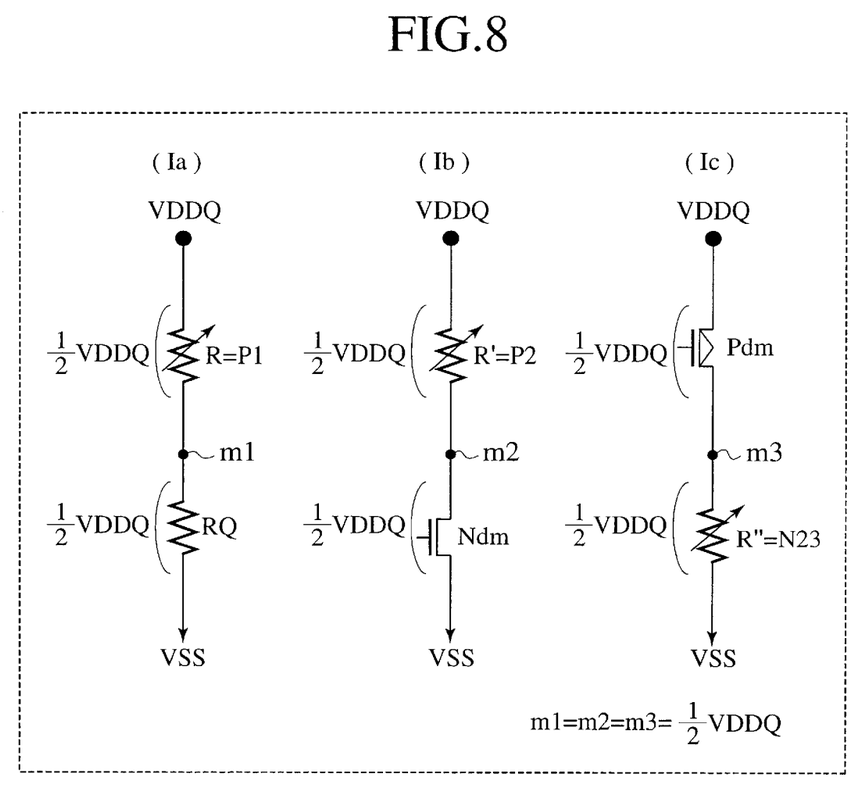
FIG. 8 shows current paths in the circuit of FIG. 7 represented with dividing resistors.

As shown in FIG. 8, the second embodiment drives an external resistor RQ, dummy buffers Pdm and Ndm, and variable resistors R (PMOS transistor P1), R' (PMOS transistor P2), and R" (NMOS transistor N2) with VDDQ/2. Therefore, there is no difference in power source margin between a pull-up control system and a pull-down control system. Namely, there is no difference in impedance adjustment accuracy between these two control systems, thereby improving the performance of the output impedance controller.

The prior art of FIG. 2 employs VDD to adjust the intermediate connection nodes to VDDQ/2, and therefore, is affected by noise in VDD as well as noise in VDDQ. On the other hand, the second embodiment of the present invention connects the sources of the transistors P1 to P3 to VDDQ, so that intermediate connection node potential may vary in response to power source noise to realize smooth recovery after noise disappearance. this results in improving the noise resistance and operational margin of the output impedance controller of the second embodiment.

Figure 9:
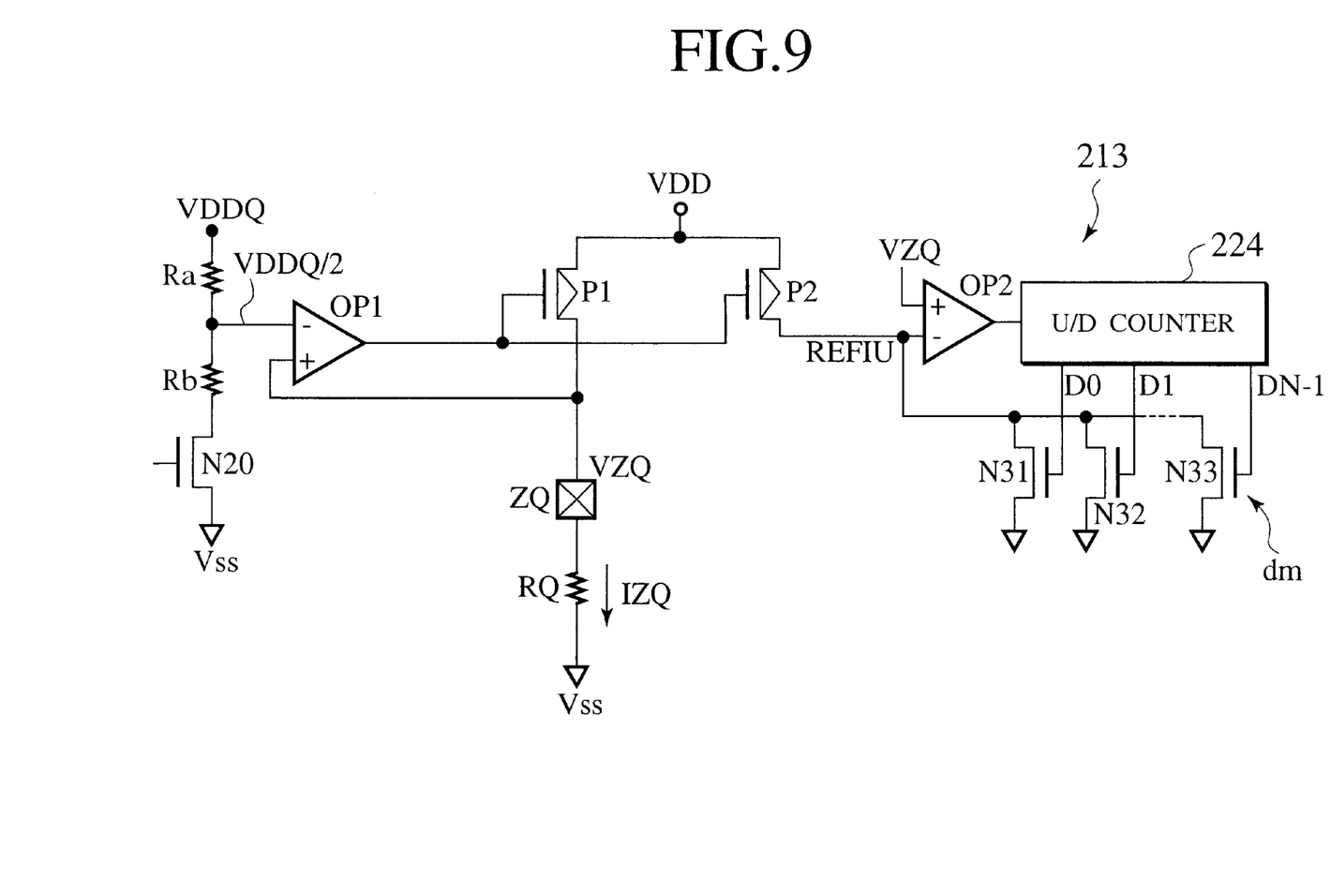
FIG. 9 is a circuit diagram showing an output impedance controller according to a third embodiment of the present invention.
Figure 10:
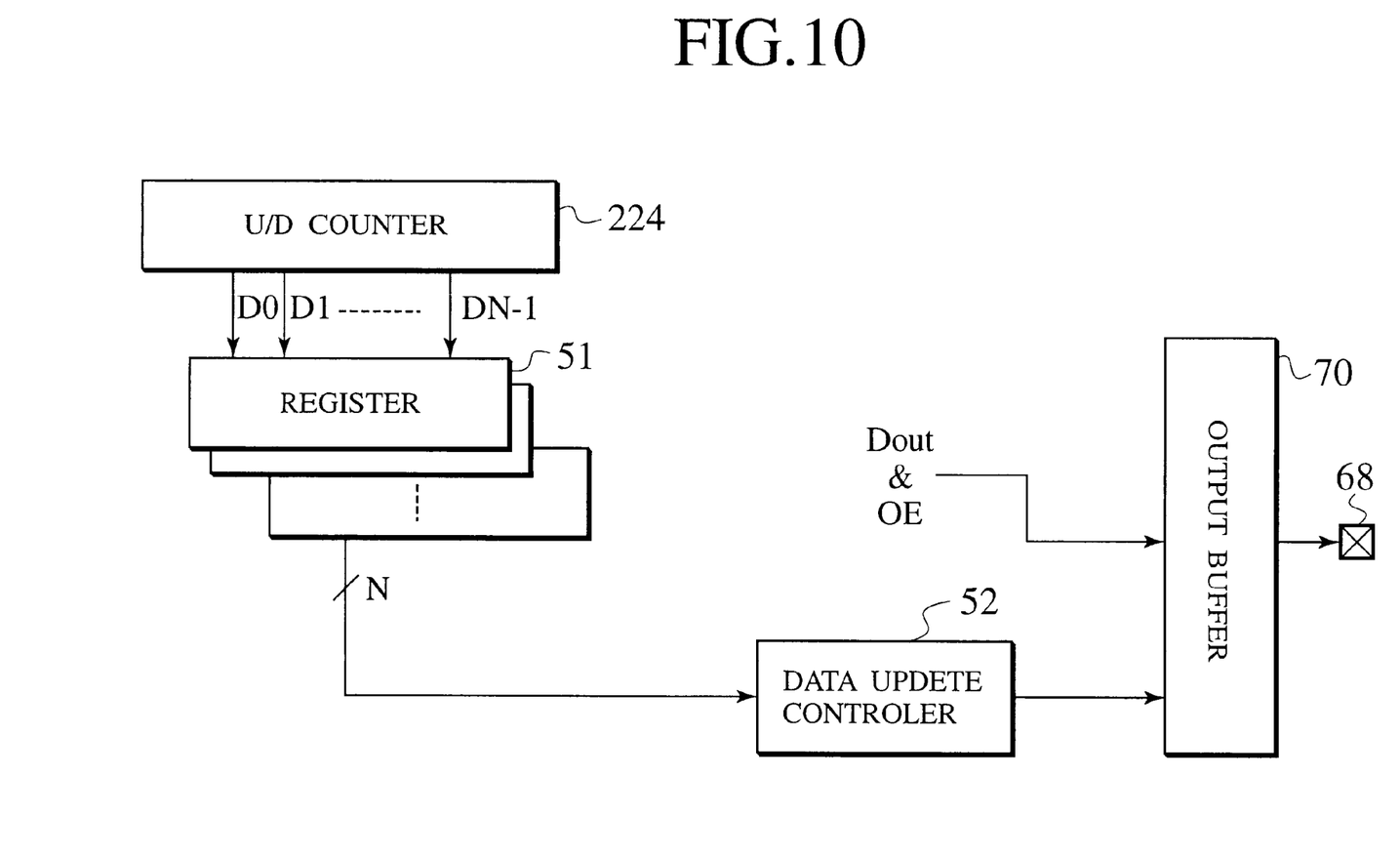
FIG. 10 is a block diagram showing the output impedance controller of the third embodiment.

FIG. 9 is a circuit diagram showing an essential part of an output impedance controller in a semiconductor device according to the third embodiment of the present invention. The third embodiment employs only NMOS transistors as drive transistors of an output buffer 70. Accordingly, the impedance of the output buffer 70 is adjusted with a single system. FIG. 10 is a block diagram showing the output impedance controller of the third embodiment for carrying out the single-system impedance adjustment.

The output impedance controller of the third embodiment has no pull-up control system. The single-system impedance adjustment of the third embodiment is carried out in the same manner as that of the first embodiment.

Figure 11:
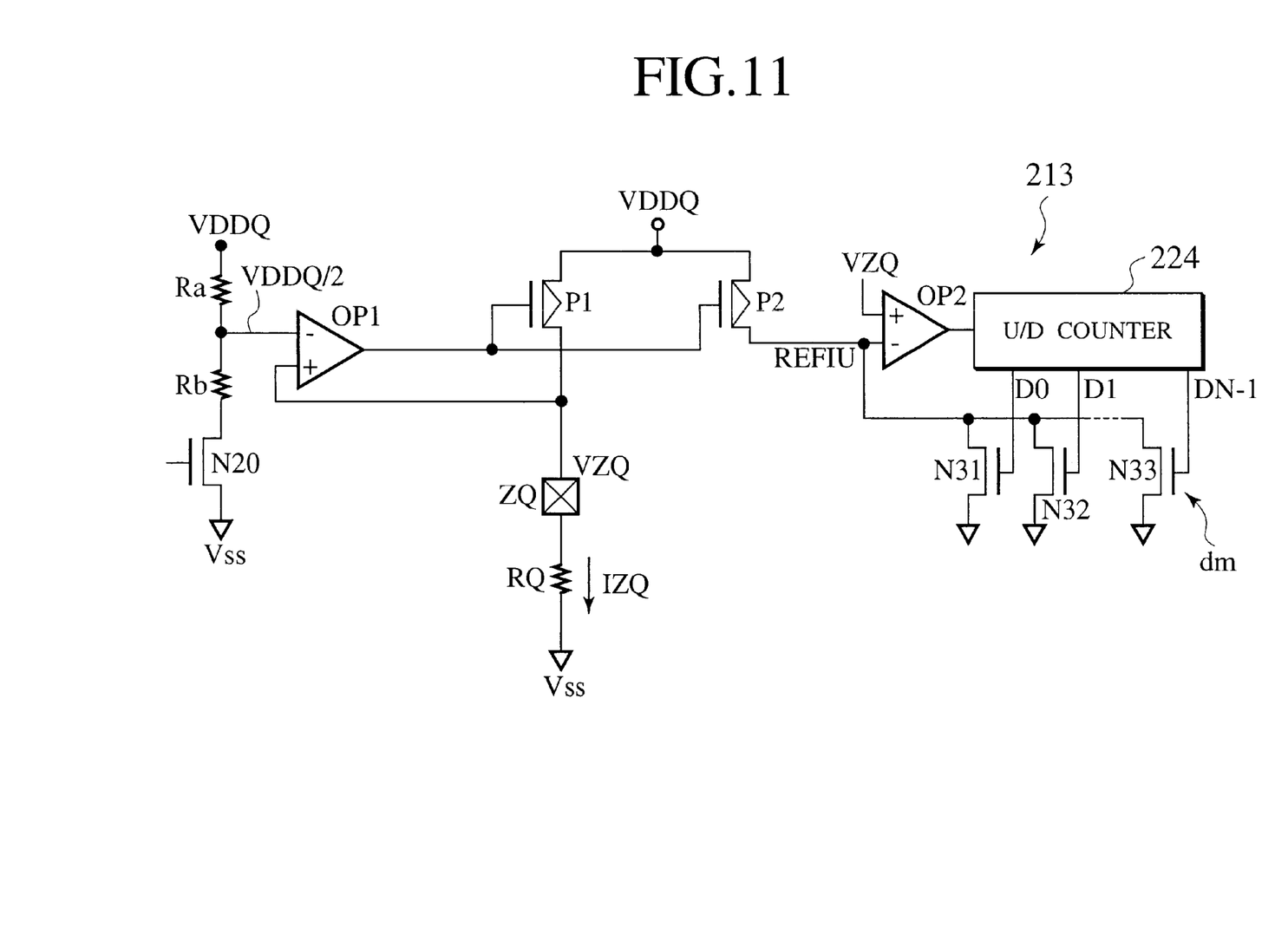
FIG. 11 is a circuit diagram showing an output impedance controller according to a fourth embodiment of the present invention.

FIG. 11 is a circuit diagram showing an essential part of an output impedance controller in a semiconductor device according to the fourth embodiment of the present invention. The fourth embodiment differs from the third embodiment of FIG. 9 in that it connects PMOS transistors P1 and P2 to a power source VDDQ. The operation and effect of the fourth embodiment are the same as those of the third embodiment.

In summary, the present invention provides a semiconductor device having an output impedance controller for precisely achieving a programmable impedance control function for an output buffer even with a low-voltage power source.

The present invention may be embodied in other specific forms without departing from the spirit or essential characteristics thereof. The embodiments of the present invention are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor device comprising:
an output buffer having transistors connected in parallel for an external driving purpose;
a connection terminal connected to an external resistor; and
an output impedance controller connected to the connection terminal and the output buffer, for adjusting the impedance of the output buffer in accordance with the external resistor, the output impedance controller having:
a first transistor of a first conductivity type connected to the connection terminal;
a first level-controller connected to a gate of the first transistor, for controlling the level of the gate of the first transistor to set the connection terminal to a predetermined voltage level;
a second transistor of the first conductivity type having a gate connected to the gate of the first transistor and a source connected to a source of the first transistor;
a first dummy transistor group connected to the second transistor, including transistors that are of a second conductivity type, are, correspond to the output buffer transistors, and are connected in parallel;
a first controller connected to the second transistor and the first dummy transistor group, for controlling the first dummy transistor group to equalize the level of a connection node between the second transistor and the first dummy transistor group with the predetermined voltage level; and
a second controller for controlling the output buffer transistors according to the control carried out by the first controller.

2. The semiconductor device claimed in claim 1, wherein the output impedance controller further has:
a third transistor of the first conductivity type having a gate connected to the gate of the first transistor and a source connected to the source of the first transistor;
a fourth transistor of the second conductivity type connected to the third transistor in series;
a second level-controller for controlling the level of the gate of the fourth transistor to equalize the level of a connection node between the third transistor and the fourth transistor with the predetermined voltage level;
a fifth transistor of the second conductivity type having a gate connected to the gate of the fourth transistor and a source connected to a source of the fourth transistor;
a second dummy transistor group connected to the fifth transistor, including transistors that are of the first conductivity type, correspond to the output buffer transistors, and are connected in parallel; and
a third controller connected to the fifth transistor and the second dummy transistor group, for controlling the second dummy transistor group to equalize the level of a connection node between the fifth transistor and the second dummy transistor group with the predetermined voltage level.

3. The semiconductor device claimed in claim 2, wherein the commonly connected sources or drains of the first and second transistors are driven by a power source that drives the output buffer.

4. The semiconductor device claimed in claim 2, wherein the predetermined voltage level is greater than zero and smaller than ½ of the voltage of a power source for driving the output buffer.

5. The semiconductor device claimed in claim 2, wherein the predetermined voltage level is ½ of the voltage of a power source for driving the output buffer.

6. The semiconductor device claimed in claim 2, wherein the output impedance controller further has a source voltage generator for providing the first level-controller with the predetermined voltage level, the source voltage generator having:
   a first resistor connected to a power source for driving the output buffer;
   a second resistor connected to the first resistor in series; and
   a connection node connected to the first and second resistors and the first level-controller;
   wherein:
      the first and second resistors are transistors whose sizes are adjusted to adjust the voltage supplied to the first level-controller.

7. The semiconductor device claimed in claim 1, wherein the sources or drains of the first and second transistors are driven by a power source for driving the output buffer.

8. The semiconductor device claimed in claim 1, wherein the predetermined voltage level is larger than zero and smaller than ½ of the voltage of a power source for driving the output buffer.

9. The semiconductor device claimed in claim 1, wherein the predetermined voltage level is ½ of the voltage of a power source for driving the output buffer.

10. A semiconductor device comprising:
   an output buffer having:
      a pull-up transistor group including transistors connected in parallel and used for external driving; and
      a pull-down transistor group including transistors connected in parallel and used for external driving;
   a connection terminal connected to an external resistor; and
   an output impedance controller connected to the connection terminal and the output buffer, for adjusting the impedance of the output buffer in accordance with the external resistor, the output impedance controller having:
      a first transistor of a first conductivity type having a drain connected to the connection terminal;
      a first level-controller connected to a gate of the first transistor, for controlling the level of the gate of the first transistor to set the connection terminal to a predetermined voltage level;
      a second transistor having a gate connected to the gate of the first transistor and a source connected to a source of the first transistor;
      a first dummy transistor group connected to the second transistor, including transistors that are of a second conductivity type, correspond to the pull-down transistor group transistors, and are connected in parallel;
      a first controller connected to the second transistor and the first dummy transistor group, for controlling the first dummy transistor group to equalize the level of a connection node between the second transistor and the first dummy transistor group with the predetermined voltage level;
      a second controller for controlling the pull-down transistor group according to the control carried out by the first controller;
      a third transistor of the first conductivity type having a gate connected to the gate of the first transistor and a source connected to the source of the first transistor;
      a fourth transistor of the second conductivity type connected to the third transistor in series;
      a second level-controller for controlling the level of the gate of the fourth transistor to equalize the level of a connection node between the third transistor and the fourth transistor with the predetermined voltage level;
      a fifth transistor of the second conductivity type having a gate connected to the gate of the fourth transistor and a source connected to a source of the fourth transistor;
      a second dummy transistor group consisting of transistors that are of the first conductivity type, connected to the fifth transistor, correspond to the pull-up transistor group transistors, and are connected in parallel;
      a third controller connected to the fifth transistor and the second dummy transistor group, for controlling the second dummy transistor group to equalize the level of a connection node between the fifth transistor and the second dummy transistor group with the predetermined voltage level; and
      a fourth controller for controlling the pull-up transistor group according to the control carried out by the third controller.

* * * * *

UNITED STATES PATENT AND TRADEMARK OFFICE
CERTIFICATE OF CORRECTION

PATENT NO. : 6,307,791 B1
DATED : October 23, 2001
INVENTOR(S) : Otsuka et al.

Page 1 of 1

It is certified that error appears in the above-identified patent and that said Letters Patent is hereby corrected as shown below:

<u>Column 10, claim 1,</u>
Line 35, change "type, are, correspond" to -- type, correspond --.

Signed and Sealed this

Ninth Day of April, 2002

Attest:

JAMES E. ROGAN
*Attesting Officer*     *Director of the United States Patent and Trademark Office*